(12) United States Patent
Gates et al.

(10) Patent No.: US 6,524,115 B1
(45) Date of Patent: Feb. 25, 2003

(54) COMPLIANT INTERCONNECT ASSEMBLY

(75) Inventors: Geoffrey William Gates, Phoenix, AZ (US); Frank E. Bumb, Jr., Phoenix, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 88 days.

(21) Appl. No.: 09/637,854

(22) Filed: Aug. 10, 2000

Related U.S. Application Data
(60) Provisional application No. 60/149,990, filed on Aug. 20, 1999.

(51) Int. Cl.[7] .............................................. H01R 12/00
(52) U.S. Cl. .......................................... 439/66; 439/67
(58) Field of Search .............................. 439/66, 67, 70, 439/71, 72, 65, 91

(56) References Cited

U.S. PATENT DOCUMENTS

| | | | |
|---|---|---|---|
| 4,050,756 A | 9/1977 | Moore | |
| 4,209,481 A | 6/1980 | Kashiro et al. | 264/24 |
| 4,571,542 A | 2/1986 | Arai | 324/158 |
| 4,574,331 A | 3/1986 | Smolley | 361/393 |
| 4,581,679 A | 4/1986 | Smolley | 361/395 |
| 5,007,841 A | 4/1991 | Smolley | 439/66 |
| 5,049,085 A | 9/1991 | Reylek et al. | 439/91 |
| 5,083,697 A | 1/1992 | Difrancesco | 228/116 |
| 5,109,596 A | 5/1992 | Driller et al. | 29/705 |
| 5,118,702 A | 6/1992 | Wollweber et al. | 514/409 |
| 5,136,359 A | 8/1992 | Takayama et al. | 357/65 |
| 5,228,189 A | 7/1993 | Driller et al. | 29/705 |
| 5,430,614 A | 7/1995 | Difrancesco | 361/785 |
| 5,599,193 A | 2/1997 | Crotzer | 439/66 |
| 5,600,099 A | 2/1997 | Crotzer et al. | 174/257 |
| 5,672,978 A | 9/1997 | Kimura | 324/54 |
| 5,759,047 A * | 6/1998 | Brodsky et al. | 439/66 |
| 5,819,406 A | 10/1998 | Yoshizawa et al. | 29/877 |
| 5,835,359 A | 11/1998 | Dr Francesco | 361/803 |
| 5,876,215 A | 3/1999 | Biernath et al. | 439/67 |
| 5,890,915 A | 4/1999 | Reylek | 439/91 |
| 6,027,346 A * | 2/2000 | Sinsheimer et al. | 439/66 |
| 6,036,502 A * | 3/2000 | Neidich et al. | 439/67 |
| 6,220,871 B1 * | 4/2001 | Otsuki et al. | 439/71 |

FOREIGN PATENT DOCUMENTS

EP    0 501 357 A1    9/1992

OTHER PUBLICATIONS

Thomas & Betts–Embedded particles ease connection problems (Dec. 1998–p. 29) from web site: www. Wnie/com/dec98copy/29–1165–12–98.htm.
PCT Search report for PCT/US01/01426.

* cited by examiner

Primary Examiner—Tho D. Ta
(74) Attorney, Agent, or Firm—Alan Ball

(57) ABSTRACT

A contact set and compressible interposer, methods for producing them and a compliant interconnect assembly for providing electrical connection of a first electronic device to a second electronic device. The compliant interconnect assembly comprises a contact set and a compressible interposer. The contact set includes an electrically insulating, flexible film with at least one conductive contact suspended therein to provide an electrically conductive path through the film. Formation of at least one de-coupling hole in the flexible film, close to a conductive contact, further contributes to independent movement of the conductive contact. A compressible interposer in the form of an electrically insulating elastomer matrix, surrounding electrically isolated conducting elastic columns, provides a localized conductive path through the thickness of the elastomer sheet. The compliant interconnect assembly forms when a contact set lies adjacent to a compressible interposer with engagement between at least one conductive contact and at least one conducting elastic column.

19 Claims, 5 Drawing Sheets

COMPLIANT INTERCONNECT ASSEMBLY

This application is a non-provisional application claiming the benefit under 37 C.F.R.§1.78(a)(4) of provisional application Ser. No. 60/149,990 filed on Aug. 20, 1999.

FIELD OF THE INVENTION

The invention relates to interconnection between integrated circuit devices and other similar devices or test structures used for burn-in or evaluation of the devices. More specifically, the invention relates to geometrical arrays of contacts, distributed through flexible films and elastomers to establish reliable, low force electrical interconnection between electronic components.

BACKGROUND OF THE INVENTION

The introduction of solid-state semiconductor electronics provided the opportunity for progressive miniaturization of components and devices. One of the benefits of such miniaturization is the capability of packing more components into a given space. This increases the features, versatility and functionality of an electronic device, usually at lower cost. A drawback of such advances is the reduction in spacing between contacts on one device and the need for accurate alignment with corresponding contacts on a second device to provide reliable electrical interconnection between the two. Modern technology, using VLSI electronics, challenges design engineers to provide such fine interconnection structures that electrical isolation between individual connectors becomes a primary concern. Current designs, for example, include spaces as low as 0.15 mm between contacts. Secondary to connector isolation is the inevitable reduction in pliability of insulating material, between electrical contacts, as the distance between contacts decreases. Thus, a geometrical array of contacts held together by a planar insulating material allows less independent movement between contacts the closer they approach each other. Absent freedom of movement, individual contacts may fail to connect to a target device, especially if some of the device contacts lie outside of a uniform plane. Lack of planarity causes variation in the distance between the device contacts and an array of contacts intended to mate with the device contacts. Accurate engagement by some contacts leaves gaps between other contacts unless independent contacts have freedom to move across such gaps. Alternatively the connecting force between an array of contacts and device contacts must be increased, for reliable interconnection, with resulting compression and potential damage for some of the contacts.

Interconnection of electronic components with finer and finer contact spacing or pitch has been addressed in numerous ways along with advancements in semiconductor device design. Introduction of ball grid array (BGA) devices placed emphasis on the need to provide connector elements with space between individual contacts at a minimum. One answer, found in U.S. Pat. Nos. 5,109,596 and 5,228,189, describes a device for electrically connecting contact points of a test specimen (circuit board) to the electrical contact points of a testing device using an adapter board having a plurality of contacts arranged on each side thereof. Cushion-like plugs made from an electrically conductive resilient material are provided on each of the contact points to equalize the height variations of the contact points of the test specimen. An adapter board is also provided made of a film-like material having inherent flexibility to equalize the height variations of the contact points of the test specimen. Furthermore, an adapter board is provided for cooperating with a grid made of an electrically insulated resilient material and having a plurality of plugs made from an electrically conductive resilient material extending therethrough. Successful use of this device requires accurate registration of contacts from the test specimen, through the three layers of planar connecting elements to the testing device.

U.S. Pat. Nos. 5,136,359 and 5,188,702 disclose both an article and a process for producing the article as an anisotropic conductive film comprising an insulating film having fine through-holes independently piercing the film in the thickness direction, each of the through-holes being filled with a metallic substance in such a manner that at least one end of each through-hole has a bump-like projection of the metallic substance having a bottom area larger than the opening of the through-hole. The metallic substance serving as a conducting path is prevented from falling off, and sufficient conductivity can be thus assured. While the bump-like projections of the anisotropic conductive films, previously described, represent generally rigid contacts, U.S. Pat. Nos. 4,571,542 and 5,672,978 describe the use of superposed elastic sheets over a printed wiring board, to be tested, and thereafter applying pressure to produce electroconductive portions in the elastic sheet corresponding to the contact pattern on the wiring board under test. In another example of a resilient anisotropic electroconductive sheet, U.S. Pat. No. 4,209,481 describes a non-electroconductive elastomer with patterned groupings of wires, electrically insulated from each other, providing conductive pathways through the thickness of the elastomer. Other known forms of interconnect structure may be reviewed by reference to United States Patents including U.S. Pat. Nos. 5,599,193, 5,600,099, 5,049,085, 5,876,215, 5,890,915 and related patents.

In addition to the problem, mentioned previously, of interconnection failure caused by gaps between contacts, an additional cause of interconnection failure occurs by occlusion of a metal contact due to surface contamination with e.g. grease, non-conducting particles or a layer of metal oxide. Such an oxide layer results from air oxidation of the metal. Since oxide layers generally impede the passage of electrical current, reliable contact requires removal or penetration of the oxide layer as part of the interconnection process. Several means for oxide layer penetration, towards reliable electrical connection, may be referred to as particle interconnect methods as provided in U.S. Pat. Nos. 5,083, 697, 5,430,614, 5,835,359 and related patents. A commercial interconnect product, described as a Metallized Particle Interconnect or MPI, is available from Thomas & Betts Corporation. The product is a high temperature, flexible, conductive polymeric interconnect which incorporates piercing and indenting particles to facilitate penetration of oxides on mating surfaces. Another commercial, electronic device interconnection product, available from Tecknit of Cranford, N.J., uses "Hard Hat" and "Fuzz Button" contacts in selected arrays. U.S. Pat. Nos. 4,574,331, 4,581,679 and 5,007,841 also refer to the "Fuzz Button" type of contact.

The previous discussion shows that interconnection of electronic devices has been an area subject to multiple concepts and much product development in response to the challenges associated with mechanical issues of interconnection and resultant electrical measurements. Regardless of advancements made, there is continuing need for improvement in three key areas, namely registration between interconnecting devices and electronic components, flexibility of contact sets for reliable device interconnection and minimization of the force required for reliable interconnection. In view of the continuing needs, associated with interconnect structures, the present invention has been developed to alleviate drawbacks and provide the benefits described below in further detail.

SUMMARY OF THE INVENTION

The present invention provides a compliant interconnect assembly for effecting reliable electrical connection between electronic devices, with contact forces much lower than previously attainable. Connection schemes, that include the compliant interconnect assembly, may be temporary for testing a semiconductor device that may be addressed via the conductive traces of a circuit used for e.g. test and burn-in.

In addition the compliant interconnect may be used as a contactor, a production socket, a burn-in socket, a probing device, a board to board interconnect, as a device to device interconnect and similar applications. The compliant interconnect is a low profile, rugged structure that forms solderless, releasable and remateable connections to delicate IC packages with application of low actuation force. Repeated cycling between connect and disconnect configurations, over extended time periods, demonstrates the remarkable durability and reliable electrical performance of compliant interconnect assemblies, according to the present invention.

More specifically the present invention provides a compliant interconnect assembly including a contact set and a compressible interposer to electrically connect a first electronic device to a second electronic device. The contact set includes an electrically insulating flexible film having at least one conductive contact suspended therein. Further, the flexible film has formed therein at least one de-coupling hole proximate the at least one conductive contact. The compressible interposer comprises an electrically insulating elastomer sheet as a matrix for at least one electrically conducting elastic column to provide a localized conductive path through the thickness of the elastomer sheet.

The compliant interconnect assembly is formed when the contact set lies adjacent the compressible interposer and at least one conductive contact engages at least one conducting elastic column. Electrical connection is made when the first electronic device and the second electronic device abut opposite sides of the compliant interconnect assembly preferably with an abutment force of less than 20 g per conductive contact.

The present invention further provides a compliant interconnect between a first electrical component and a second electrical component. Such a compliant interconnect comprises an electrically insulating flexible sheet having at least one conducting pathway therethrough and having formed therein at least one de-coupling hole, proximate the at least one conducting pathway.

A method for forming a contact set comprising a plurality of conductive contacts electrically isolated from each other comprises a number of steps after providing a copper plate having a first side and a second side. The first side has a plurality of islands of etch resist thereon and a pattern of protected areas of etch resist covers the second side. Application of etchant to the copper plate forms a plurality of engineered asperities on the first side of the copper plate and a pattern of posts on the second side of the copper plate. After removing the etch resist an insulating film, having an adhesive coated side, an exposed side and a plurality of holes formed therein, corresponding to the pattern of posts, is laminated to the second side of the copper plate, with the adhesive in contact with the copper plate, and the pattern of posts extending into the plurality of holes in the insulating film. Photoresist is applied to the resulting laminate over the first side of the copper plate and the exposed side of the insulating film before exposing the first side to a first radiation pattern and applying etch resist to areas of the first side of the copper plate exposed during development of the photoresist. After removing residual photoresist from the first side of the copper plate, the application of etchant produces a plurality of individual bumps adjacent to the adhesive covered side of the insulating film. Removal of etch resist reveals engineered asperities attached to individual bumps. Exposure and development of photoresist, on the exposed side of the insulating film, according to a second radiation pattern, produces openings in axial alignment with the pattern of posts and the plurality of holes formed in the insulating film. Deposition of copper on the pattern of posts forms contact tails protruding from the insulating film. Thereafter, removal of residual photoresist produces a contact set, according to the present invention, having conductive contacts electrically isolated from each other by the insulating film.

The present invention further includes a method of forming a compressible interposer comprising a plurality of conducting elastic columns electrically isolated from each other. The method comprises a number of steps after providing a composite sheet having a first spacer layer in removable contact with a second spacer layer removably laminated to both sides of an electrically insulative elastomer sheet. A plurality of holes is formed to extend through the composite sheet before filling the plurality of holes with a curable conductive fluid. After curing, the conductive fluid forms conducting elastic columns electrically isolated from each other. Removal of the first and second spacer layers provides a compressible interposer having conducting compliant projections extending on both sides of the elastomer sheet.

Terms used herein have the meanings indicated as follows:

The term "Standard Pitch" refers to a centerline-to-centerline separation of 0.8 mm to >1.27 mm between individual contact pads in a multiple-contact array.

The term "Fine Pitch" refers to a centerline-to-centerline separation of 0.5 mm to 0.75 mm between individual contact pads in a multiple-contact array.

The term "Super Fine Pitch" refers to a centerline-to-centerline separation of 0.2 mm to 0.4 mm between individual contact pads in a multiple-contact array.

"Pre-load actuation" refers to the height reduction of a conducting elastic column produced when sufficient force has been applied to an interconnect assembly according to the present invention to provide reliable electrical connection.

"Pre-load deflection" refers to the height of a conducting elastic column under pre-load actuation.

"Pre-load actuation force" refers to the average weight applied to each contact point to provide reliable electrical connection.

"Full stroke actuation" refers to the height reduction of a conducting elastic column produced when sufficient force has been applied to the interconnect assembly to provide reliable electrical connection allowing for variation in contact/BGA planarity.

"Full stroke deflection" refers to the height of the conducting elastic column under full stroke actuation.

"Maximum or full stroke actuation force" refers to the average weight applied to each contact point to provide reliable electrical connection during full stroke deflection.

"Contact resistance" refers to the electrical resistance contributed in the electrical current conducting pathway, by the interconnection assembly.

"Number of actuations" indicates the maximum possible number of make and break connections between an interconnection assembly according to the present invention and a target device.

"De-coupling hole" refers to an opening formed in a film or planar element or sheet to make the sheet more pliable. Removal of material between portions of a sheet reduces the influence that movement of one portion has upon the other. The portions have become de-coupled by removal of material. Incorporation of de-coupling holes (see FIGS. 1 and 8) in contact sets and compressible interposers, either separately or both together, provides more freedom of movement for individual conductive contacts and conducting elastic columns by reducing the direct influence of movement of the substrate film or elastomeric sheet respectively. De-coupling holes distributed around individual contacts or conducting columns as random or geometric clusters allow greater freedom and beneficial displacement of these interconnecting components.

BRIEF DESCRIPTION OF THE DRAWINGS

In the following, the invention will be described in greater detail by way of examples and with reference to the attached drawings, in which.

DETAILED DESCRIPTION OF THE INVENTION

Figure 1:
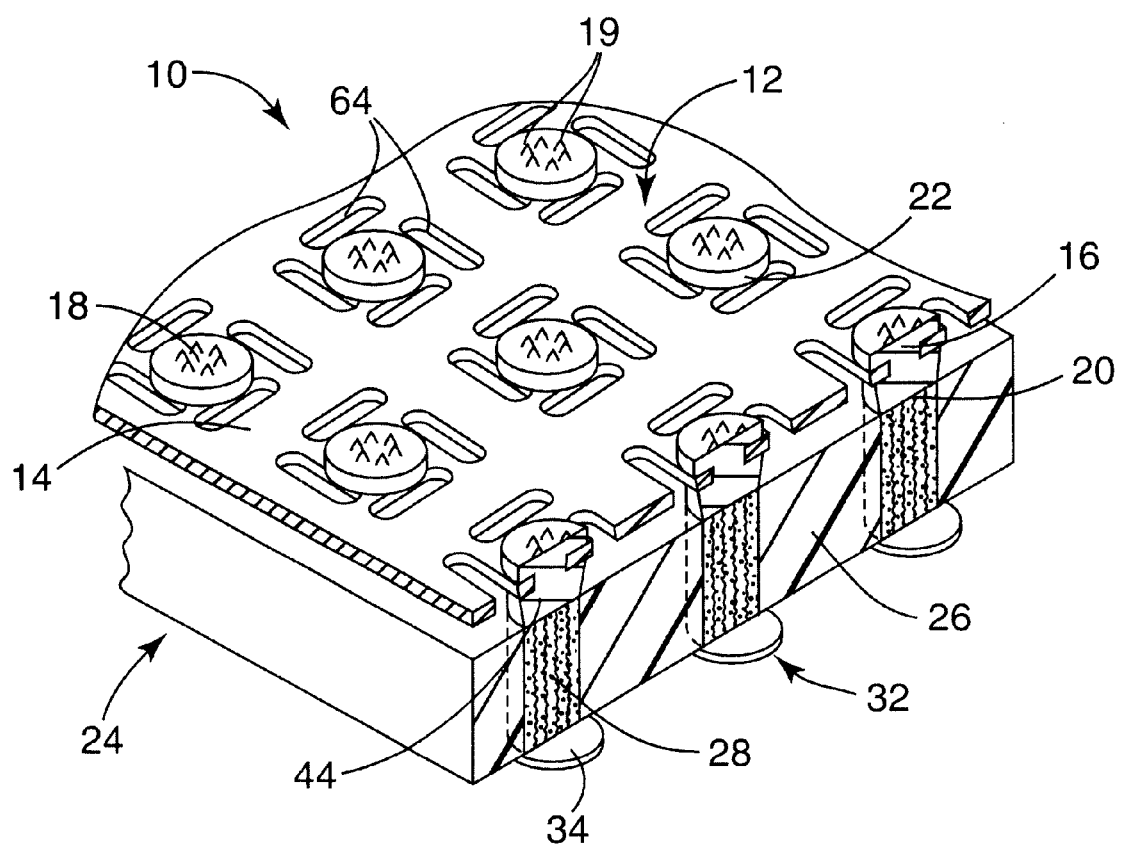
FIG. 1 is a perspective view showing a contact set and compressible interposer according to the current invention.

Referring to the drawings wherein like numbers refer to like parts throughout the several views, FIG. 1 shows a compliant interconnect assembly 10, comprising a contact set 12 and a compressible interposer 24 according to the present invention. The contact set 12 includes a flexible film material 14 that has conductive contacts 16 received and suspended in holes (not clearly shown) machined through the thickness of the film 14. Since the conductive contacts 16 must be electrically isolated from each other, the flexible film 14 is electrically non-conductive. Patterns of conductive contacts 16 in the contact set 12 may take any form depending on the corresponding contact patterns on electronic devices to be interconnected. Preferably the conductive contacts 16 are essentially rigid, non-compliant contacts held in the holes in the flexible film 14 such that portions of the conductive material overlap the upper and lower edges of the holes, protrude on either side of the flexible film 14 and have upper 18 and lower 20 contact surfaces. For optimum interconnection the upper contact surfaces 18 preferably possess coplanarity in a plane above the flat, flexible film 14 with similar coplanar relationship of the lower contact surfaces 20 in a plane below the flexible film 14. The upper contact surface 18 of each conductive contact 16 includes pointed projections 19, also referred to herein as engineered asperities. Engineered asperities 19 are sharp tipped barbs of suitable hardness to penetrate any oxide coating present at the surface of contacts that may be engaged, for electrical interconnection, by the contact set 12 according to the present invention. Both the presence of engineered asperities 19 and method for their formation at the upper contact surface 18 represent aspects of the present invention for reliable electrical connection at low contact force. While the portion of the conductive contact 16 above the surface of the film 14 has a surface designed for optimum contact with an electronic device, the design of the portion of the conductive contact 16 below the film focuses contact force at the interface between a conductive contact 16 and a conducting elastic column 28 positioned in voids machined in an elastomer sheet 26.

The process of forming the contact set 12 uses multiple steps according to common practices for forming and plating printed circuit features. Such steps include surface cleaning, etching or chemical milling, laminating and electroplating as described herein, with reference to FIGS. 1–5, for converting a copper plate into the conductive contacts 16 held suspended in holes formed in the flexible insulating film 14. The initial step requires a copper plate, preferably 0.38 mm to 0.40 mm (0.015 to 0.016 inches) thick which was previously cleaned to remove dirt, debris and any surface contamination. Conventional photoresist exposure and development techniques produce a protective surface covering including a patterned grid of circular areas of exposed copper on both sides of the copper plate. On one side of the plate the areas of exposed copper correspond to placement for engineered asperities 19. The resist pattern on the other side of the plate sets the position of a plurality of posts 40 formed by etching the copper plate. Etching of the asperities 19 requires application of tin/lead etch resist over the areas of exposed copper, removal of the residual photoresist and application of etch solution to produce cone-shaped etch tips, or asperities 19 preferably having a height of about 0.05 mm (0.002 inch) and a tip diameter of less than 0.025 mm (0.001 inch) at the sharpest point. Following a similar process, application of etch resist to the opposite side of the copper plate provides protection, during etching, for areas of copper exposed after development of exposed photoresist. Removal of remaining photoresist leaves etch resist covering surface spots of the copper plate. Application of etch solution across the surface produces contours in the copper layer that appear as tiny posts 40 (see FIG. 5) having a preferred height of about 0.20 mm to 0.30 mm (0.008–0.012 inches). Subsequent removal of the resist, drying and cleaning provides a copper panel having a pattern of a plurality of posts 40 on one side and pointed tips or engineered asperities 19 on the other. The pattern of posts corresponds to a hole pattern, produced in an insulating film 14, preferably polyimide film 0.05 mm (0.002 inch) thick, having the tradename Kapton. An adhesive coating, applied to the insulating film 14 provides attachment to the post-patterned side of the copper panel with registration such that the posts 40 extend into the holes formed in the film 14. In addition to the holes that accommodate the pattern of posts 40 the film may include perforations, also referred to herein as lacing, to provide de-coupling holes (see FIG. 8) around conductive contacts 16. A strong bond between the film 14 and copper panel requires lamination at elevated temperature and increased pressure. Preferably, the conditions for lamination include temperatures of about 145° C. (290° F.) and about 50 psi to about 100 psi for times up to and including about 90 mins. During the lamination process, the fragile copper panel may require the conventional protection of slip-sheet inserts to provide a lamination stack. The top layer of the stack is a copper press insert sheet having a hole pattern of suitable size and registration to accommodate and protect the tips of the etched posts 40.

After lamination and removal of the copper press insert and slip sheets a composite panel remains, including the polyimide layer firmly bonded to one side of the copper panel. The other side of the copper panel shows evidence of the pointed tips or engineered asperities 19. This surface changes to a studded surface after application of photoresist material, exposure to suitable pattern of actinic radiation, and development of the imaged photoresist followed by application of etch resist, removal of residual photoresist and thereafter etching a pattern of bumps or heads 22 opposite and corresponding to the pattern of posts 40 on the other side of the copper panel. The posts 40 protrude through the flexible sheet 14 and need to be secured within the holes formed in the flexible sheet 14. This requires addition of metal, preferably by deposition of copper, in the holes, and around the posts with plating continuing until sufficient metal accumulates to provide tails 44, slightly overlapping the holes in the insulating film and extending approximately 0.15 mm (0.006 inches) from the film 14. The application of photoresist material, imaging, development and plating steps produces tails 44 of desired shape and dimensions. Metal plating increases the size of the tails 44 to physically lock the conductive contacts 16 into the insulating sheet 14 with suitable separation that they provide isolated channels for passage of electrical current. Complete isolation of the conductive contacts 16, however, requires application of photoresist to the remnants of the copper panel still attached to the insulating film opposite the tails 44 just formed. Exposure of the photoresist to suitable actinic radiation produces a pattern, after development that protects the previously formed bumps 22. Application of etch solution thereafter removes the material between the bumps 22 leaving them isolated from each other, and in alignment with the tails 44. The bumps 22 and tails 44 are joined to each other to provide shaped, electrically conductive pegs or conductive contacts 16 passing through the holes in the insulating film 14 and extending on either side of the film 14. Preferred conductive peg dimensions include pointed tips or asperities 19 of about 0.05 mm (0.002 inch), a head or bump of about 0.08 mm (0.003 inch) and a tail 44 of about 0.36 mm (0.014 inch) for a total contact length, from tip 19 to tail 44 from about 0.50 mm (0.020 inch) to about 0.60 mm (0.023 inch). Each conductive contact has a diameter of about 0.7 mm (0.028 inch) for a contact set 12 having a contact pitch of about 1.25 mm (0.05 inch). The contact set 12 includes the insulating polyimide film 14, which has a preferred thickness of about 0.05 mm (0.002 inch).

There are two methods for forming the compressible interposer 24 according to the present invention. One method requires the formation of a planar sheet of elastomer by casting it inside a rigid frame before curing. The second method uses a pre-cured planar sheet of elastomer with the desired dimensions. Holes drilled in the elastomer sheet 26 provide channels for electrically conducting elastic columns 28 that jut out slightly beyond the opposite faces of the elastomer sheet 26. A preferred method of forming a compressible interposer 24, using silicone elastomer compositions, includes providing a planar sheet of silicone elastomer, preferably a platinum-catalyst cured silicone elastomer 1.0 mm (0.04 inch) thick having two spacer layers of protective tape overlying both sides of the planar sheet. Silicone adhesive provides attachment of the protective tape to form this laminated structure. The tape should be transparent to allow observation of intimate contact between the layers, without entrapment of air bubbles. A drilling sequence provides a hole pattern in the laminate structure according to the contact pattern of an electronic device to be interconnected or tested. Fluid conductive silicone, poured into each hole, requires curing to form electrically conducting elastic columns through the silicone sheet. Typically, conductive silicone fluids comprise curable silicone compositions containing conductive particles including, but not limited to particulate metals such as copper, nickel, silver coated metals, and conductive carbon particulates and the like. After curing of the conducting elastic columns, removal of excess conductive silicone requires shaving of material from front and back surfaces of the laminate structure. Upon removal of the outer first spacer layer of tape, from both sides of the laminate, rows of column tips appear that are sized according to the column diameters and thickness of the spacer layer. The possibility that some of the column tips may have contact surface irregularities leads to the need for a second shaving step, against the smooth surface of the second spacer layer, until there is coplanarity of the spacer layer surface with the contact surfaces 38,39 of the conducting elastic columns 28. After removing the remaining layers of tape, from both surfaces of the planar silicone sheet, rows of compliant projections appear, this time with essentially uniform coplanar contact surfaces 38,39 to allow reliable contact between electronic devices via the conducting silicone columns 28. Before use, the compressible interposer 24 requires cleaning to remove surface contamination and debris. Thus formed, compressible interposers 24 have attributes including precise construction, high flexibility, high resilience, high durability and low profile. They provide interconnect devices emulating springy conductors, sometimes referred to as pogo pins, without any mechanical biasing elements such as springs.

Previously described contact sets 12 and compressible interposers 24 provide z-axis conducting interconnect structures. Such interconnects may be used alone or in combination to provide conductive paths between electrical or electronic components, particularly those electronic devices having the fine contact pitch associated with semiconductor devices.

Figure 2:
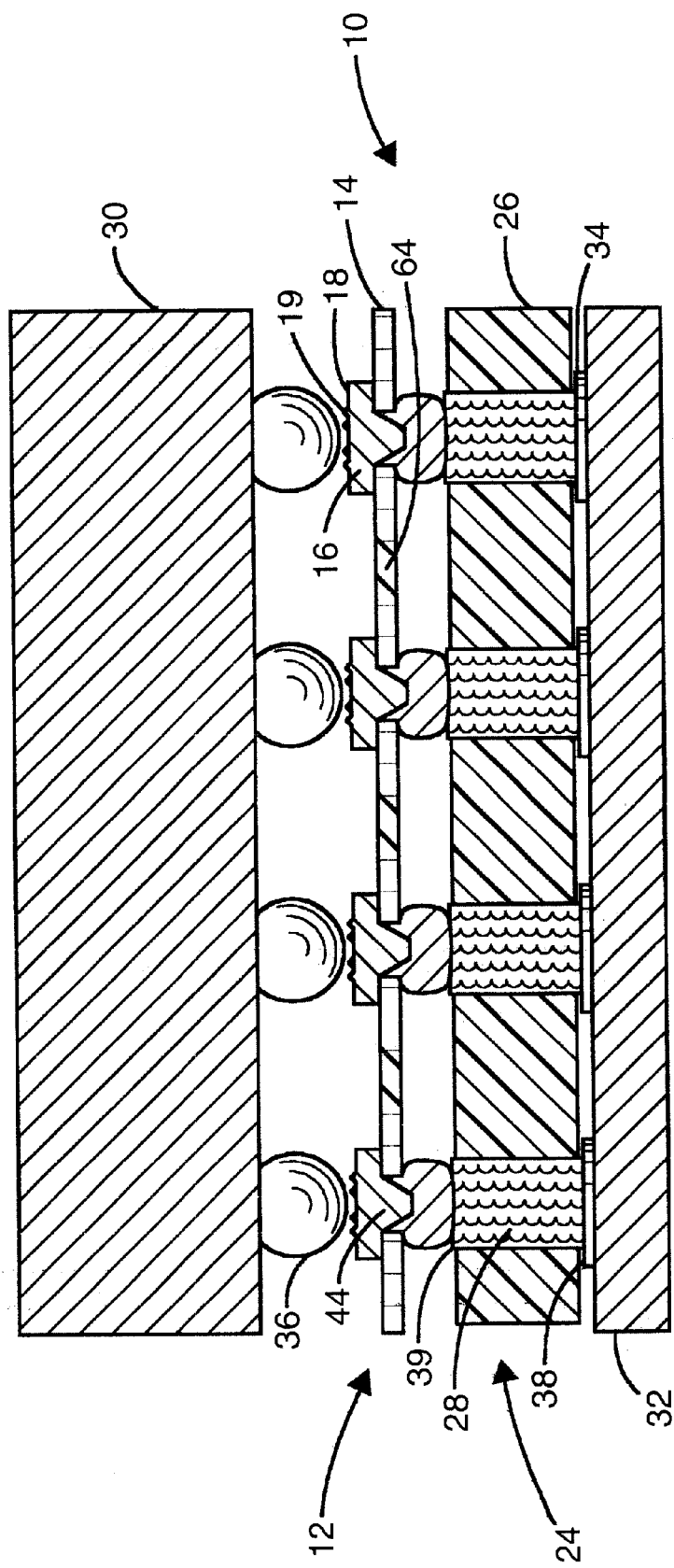
FIG. 2 is a cross sectional view depicting a compliant assembly, according to the current invention, positioned between electronic devices for electrical connection thereof.

Having described the formation of a contact set 12 and compressible interposer 24, reference is made to FIG. 2 to show how these two parts preferably work together for low contact force interconnection between electronic devices and an electronic device and a test board, for example. The figure includes an electronic device 30 that uses the ball elements 36 of a ball grid array (BGA) for interconnection with a load or test board 32. Connection points on the load or test board 32 take the form of planar contacts 34. Interconnection of the electronic device 30 to the load or test board 32 may utilize a compliant interconnect assembly 10 according to the present invention. Preferably a compressible interposer 24 makes contact with the load or test board 32 via the lower contact faces 38 of the conducting elastic columns 28. The upper contact faces 39 of the conducting elastic columns 28 engage the tail portion 44 of corresponding conductive contacts 16 held in the flexible insulating film 14. Engineered asperities 19 on the top surface 18 of the conductive contacts 16 make reliable contact with the BGA by penetrating or abrading or otherwise disrupting any oxide covering that may have formed on the ball elements 36 of the BGA. The arrangement of electronic device 30, contact set 12, compressible interposer 24 and load or test board 32, allows convenient passage of current between the device 30 and the load board 32. This type of interconnection benefits from the reduced force needed to provide reliable connection, e.g. between devices, compared with previous interconnection schemes. Connection force reduction relies upon attributes associated with both the contact set 12 and the compressible interposer 24. For example, the sharpness of the engineered asperities 19 assures essentially instant, current conducting electrical contact without concern to the surface condition of the ball elements 36 of the BGA. Therefore, little force need be applied to connect the BGA to the contact set 12. On the other side of the flexible sheet 14, the shape of the tails 44 of the conductive contacts 16 has a design for efficient interaction with the upper contact faces 39 of the conducting elastic columns 28 of the compressible interposer 24. The contact surface 20 of the tail 44 is slightly smaller in area than the contact face 39 of a conducting elastic column 28. This causes the elastomeric contact surface 39 to wrap around the tail 44 of the conductive contact 16 of the contact set 12 with pressure applied at the interface between them. The "wrap-around" effect benefits by the elastic column 28 projecting from the face of the elastomer sheet 26 that contains the conducting elastic columns 28. This compliant projection, not being confined by the main body of elastomer 26, is somewhat more flexible than the body of the conductive column 28 surrounded by the elastomer 26. Added flexibility provides more ready conformability of the compliant projection to the tail 44 of the conductive contact 16 with resultant reduction in the connection force. Similarly the compliant projection associated with the lower contact surface 38, of a conducting elastic column 28, allows slight spreading and thereby slightly increased area of contact between the lower contact face 38 and a load or test board 32. The combined effect of engineered asperities 19 and compliant projections allows the lowering of connection forces into a range of about 10 g to about 20 g per contact. Further lowering of connection forces may result from lacing to provide de-coupling holes 64 with either the contact set 12 or the compressible interposer 24.

Figure 3:
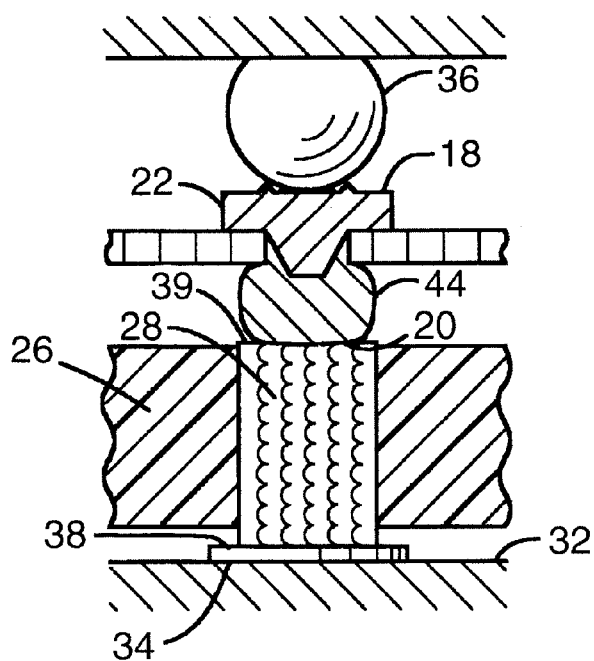
FIG. 3 is a cross section providing detail of the alignment of parts forming an electrically conducting path between electronic devices.
Figure 4:
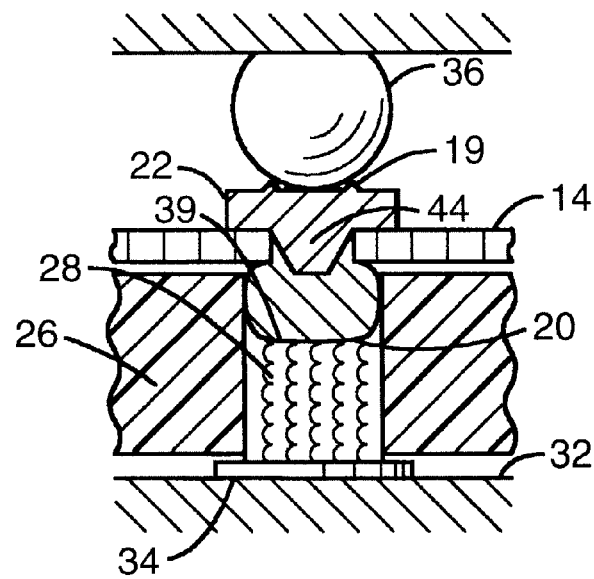
FIG. 4 is a cross sectional view depicting the electrically conductive path, between electronic devices, as it would appear under compression.

FIG. 3 and FIG. 4 provide added detail of the interconnection of a single ball element 36 of a BGA with a contact pad 34 of a load or test board 32 using a compliant assembly 10 according to the present invention. FIG. 3 shows the parts in alignment without added pressure for reliable interconnection. FIG. 4 shows the expected configuration with. contact force applied to effect suitable connection for passage of electric current through a single connection point. The added pressure forces the tail 44 of the conductive contact 16 into the upper face 39 of the conducting elastic column 28 which now has the appearance of cupping the tail 44 of the conductive contact 16. The lower contact face 38 of the elastic column 28, engaging the planar contact pad 34 of the load or test board 32, appears to have spread slightly over the pad 34. To achieve this condition for effective interconnection the conductive elastic columns 28 must be compressed between about 15% and about 40% of their uncompressed height.

Figure 5:
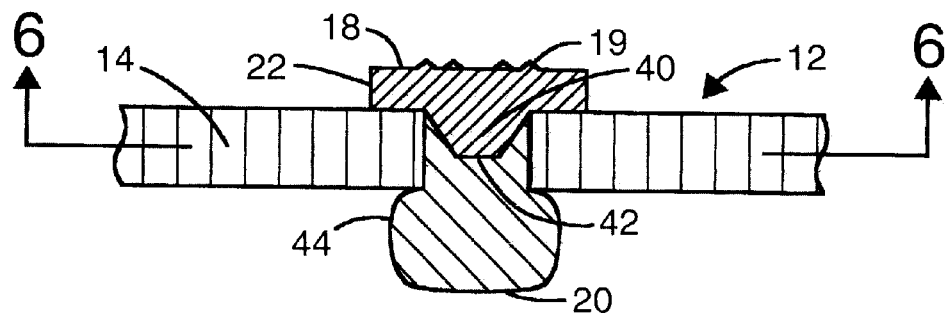
FIG. 5 is a cross sectional detail view of a contact, according to the present invention.

FIG. 5 provides a cross-section through one of the conductive contacts 16 in the contact set 12. A processing sequence produces the conductive contact 16 providing it with features including engineered asperities 19 above the flexible insulating film 14, a post 40 disposed through the film 14 and a metal, tail-forming socket 42 surrounding the post 40. Portions of the upper surface 18 and the tail 44 of the conductive contact 16 overlap the edge of the hole formed in the flexible film 14. The overlapping condition provides secure attachment of the conductive contact 16 to the insulating flexible film 14.

Figure 6:
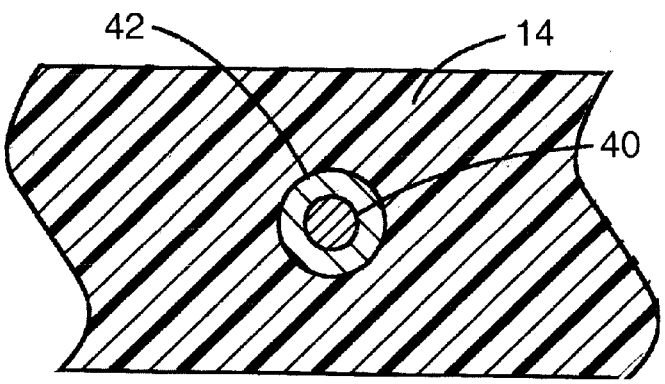
FIG. 6 is a plan view taken through line 6—6 of FIG. 5 to show the internal structure of a contact of the contact set according to the present invention.

FIG. 6 shows a plan view of a cross section through a conductive contact 16, according to the present invention, taken through line 6—6 of FIG. 5. The post 44, previously etched from a copper panel appears as a circle 44 surrounded by a metallic collar 42, representing the socket 42 produced by plating around the post 44 from the reverse side of the flexible film 14.

Figure 7:
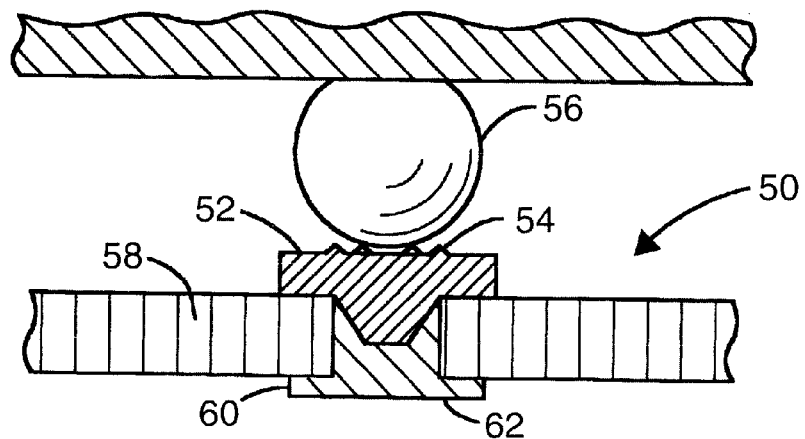
FIG. 7 is a cross sectional view showing a contact set having a conductive contact with a disc shaped lower contact.

FIG. 7 shows a compliant interconnection assembly 50 wherein the conductive contact 52 includes oxide-penetrating particulates 54 on the surface that engages a ball element 56 of a BGA. The conductive contact 52 resides in a hole in a flexible film material 58, held therein by metal overlapping above and below the hole. However, the portion of the conductive contact below the flexible film has the form of a flat disc 60, of less height than a tail 44 according to the present invention, such that its contact face 62 lies relatively close to the surface of the film 58. Compared to the interconnection force, axially applied to tails 44 of the present invention, the disc-like contact 60 requires increased force, as shown in Table 1, to effect equivalent reliable electrical interconnection as further discussed in the following section.

Figure 8:
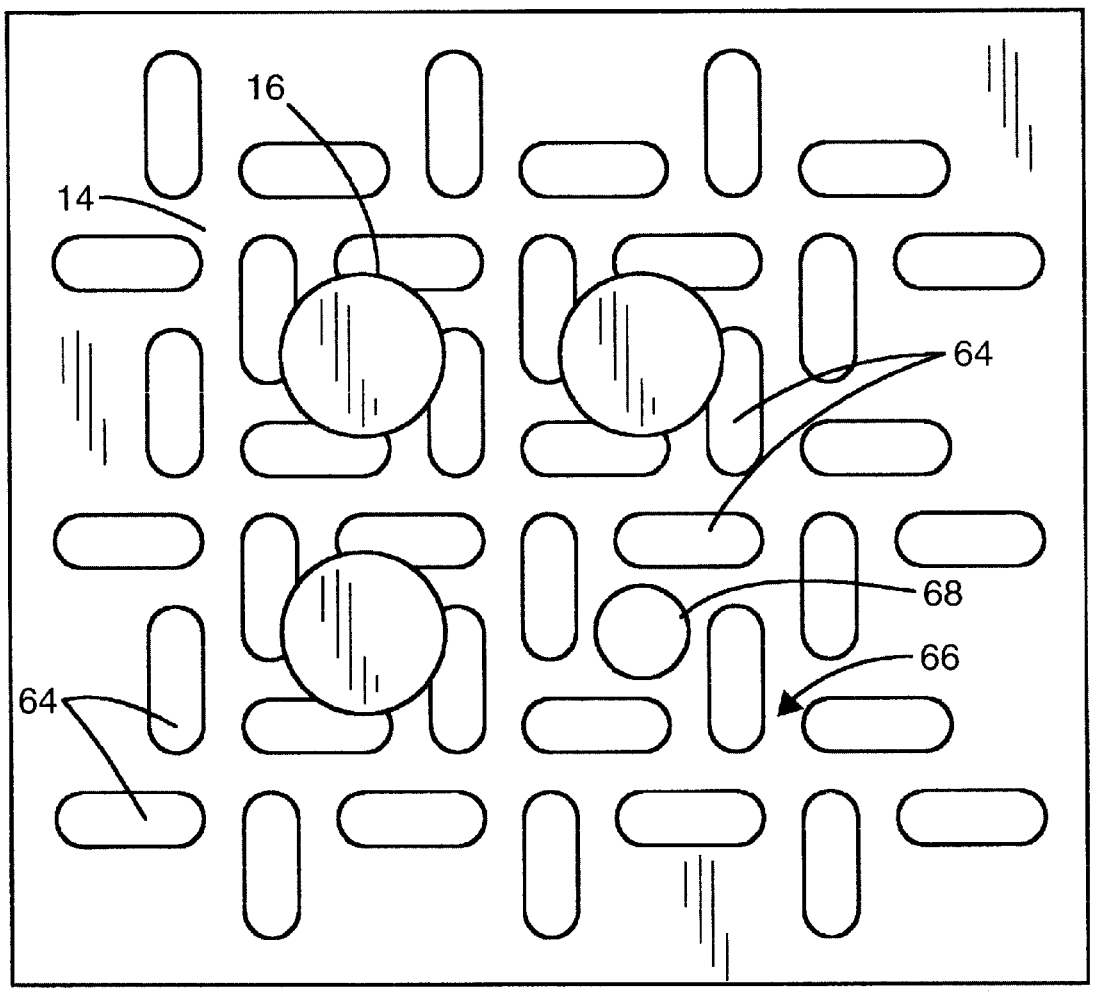
FIG. 8 is a plan view of conductive contacts, according to the present invention, suspended in a film including a pattern of de-coupling holes.

A distinguishing feature according to the present invention is the introduction, into either the flexible film 14 or the elastomeric sheet 26, of clusters of openings to provide more freedom of movement for individual conductive contacts 16 and conducting elastic columns 28 by reducing the area of the film 14 or elastomeric sheet 26 attached to them. The openings or perforations, that lead to reduction in the area of attachment, may be referred to as de-coupling holes 64, because they allow the contacts 16 and columns 28 to move independently, de-coupled from the flexible film 14 and the elastomeric sheet. Preferably the clusters of openings form a repeating, geometric pattern. FIG. 8 shows one embodiment of a suitable de-coupling hole 64 pattern that further releases the conductive contacts 16 and alternatively the conducting elastic columns 28 for improved conformability to accommodate lack of coplanarity of e.g. ball contacts of a ball grid array. Typical ball grid arrays possess about 0.15 mm (0.006 inch) to about 0.20 mm (0.008 inch) of variant noncoplanarity. Layers 12 and 24 accommodate height variation, adjusting for at least a 25% range of compression, thereby compensating for mechanical imperfections inherent with conventional ball grid arrays.

A portion of FIG. 8 shows a hole pattern 66 for a film 14 or elastomeric sheet 26 that does not include a contact 16 or conducting elastic column 28 in the central receiving hole 68. The lacing pattern of elongate de-coupling holes or perforations 64, as shown, is distributed symmetrically around the receiving hole 68. This is a preferred distribution of de-coupling holes 64 for improving the deflection of individual contacts 16. However, there is no restriction on the design of the lacing pattern or the shape of de-coupling holes 64. Also, the patterns of receiving holes 68 and de-coupling holes 64 may be formed in either an insulating film 14 or elastomer sheet 26 using conventional processes including drilling, punching and laser ablation. Preferred de-coupling hole 64 separation corresponds to standard pitch as defined above.

A compliant interconnect assembly according to the present invention provides advantages compared to conventional interconnect structures particularly regarding the force per contact required for reliable electrical connection between e.g. a device under test and a test board. It is known that standard pitch devices (0.8 mm to >1.27 mm) require a force per contact of about 30 g to about 50 g to provide reliable electrical connection. A fine pitch device requires application of about 30 g force per contact and a super fine pitch device, e.g. a chip scale package, requires about 20 g per contact for reliable electrical connection. There is a noticeable reduction in the amount of force per contact when a compliant interconnect assembly according to the present invention replaces a conventional interconnect structure. The combination of a contact set 12 and a compressible interposer 24 lowers the force per contact to below 20 g per contact, preferably below 15 g per contact for a standard pitch device. An added advantage of the lowering of applied force per contact is the increase in the number of uses or actuations of compliant interconnect assemblies according to the present invention. This provides a measure of the number of devices that may be tested using a single interconnect assembly. While conventional, standard pitch interconnection systems provide up to about 200,000 actuations the compliant interconnect assembly 10 survives more than 1 million such actuations. As previously described, the cupping action of the upper face 39 of a conducting elastic column 28 around the contact tail 44 of a conductive contact 16 increases the relative area of contact between the surfaces of the contact 16 and the column 28. Also the lower contact face 38 of the elastic column 28 engages a planar contact pad 34 of the load or test board 32, appearing to spread slightly over the pad 34 for expanded area of contact. This condition of effective interconnection may be achieved by compression of elastic columns 28 by between about 15% and about 40 % of their uncompressed height, using an applied force per contact of less than 20 g.

TABLE 1

PROPERTY COMPARISON

| PROPERTY | 65 DUROMETER ELASTOMER SHEET | | 37 DUROMETER ELASTOMER SHEET | |
| --- | --- | --- | --- | --- |
| | FLAT DISC | TAIL | FLAT DISC | TAIL |
| PRE-LOAD | | | | |
| actuation | 39% | — | — | 17% |
| deflection | 0.36 mm | 0.28 mm | 0.33 mm | 0.15 mm |
| actuation force | 16 g/lead | 14 g/lead | 8 g/lead | 4 g/lead |
| FULL STROKE | | | | |
| actuation | 56% | — | — | 39% |
| deflection | 0.56 mm | 0.48 mm | 0.53 mm | 0.36 mm |
| actuation force | 46 g/lead | 28 g/lead | 26 g/lead | 12 g/lead |
| contact resistance | 70 milli ohm | 40 milli ohm | 40 milli ohm | 40 milli ohm |
| NUMBER OF ACTUATIONS | 200,000 | — | — | 1,250,000 |

Table 1 shows the improvement associated with tail contacts versus flat disc contacts, and indicates how sheet flexibility, expressed by a durometer value, affects the deflection and force required for full stroke actuation. A relatively high durometer material combined with flat disc contacts causes higher contact resistance compared to the use of tail contacts or more flexible, lower durometer interposer sheets.

Low contact force, flexible, interconnection assemblies and related structures have been described herein. These and other variations, which will be appreciated by those skilled in the art, are within the intended scope of this invention as claimed below. As previously stated, detailed embodiments of the present invention are disclosed herein; however, it is to be understood that the disclosed embodiments are merely exemplary of the invention that may be embodied in various forms.

What is claimed is:

1. A compliant interconnect assembly to electrically connect a first electronic device to a second electronic device, said compliant interconnect assembly comprising:

a contact set including an electrically insulating flexible film having at least one conductive contact, having a maximum actuation force of less than 20 g, suspended therein, said flexible film further having formed therein at least one de-coupling hole, proximate said at least one conductive contact; and a compressible interposer comprising an electrically insulating elastomer sheet as a matrix for at least one electrically conducting elastic column to provide a localized conductive path through the thickness of said elastomer sheet, said compliant interconnect assembly being formed when said contact set lies adjacent said compressible interposer, there being engagement between said at least one conductive contact and said at least one conducting elastic column for electrically connecting said first electronic device and said second electronic device abutting opposite sides of said compliant interconnect assembly.

2. A compliant interconnect assembly according to claim 1, said electrically insulating elastomer sheet having formed therein at least one de-coupling hole proximate said at least one electrically conducting elastic column.

3. A compliant interconnect assembly according to claim 1, wherein said electrically insulating elastomer sheet is a cured silicone sheet.

4. A compliant interconnect assembly according to claim 1, wherein said at least one electrically conducting elastic column comprises conductive particles.

5. A compliant interconnect assembly according to claim 4 wherein said conductive particles are selected from the group consisting of metal particles and conductive carbon particles.

6. A compliant interconnect assembly to electrically connect a first electronic device to a second electronic device, said compliant interconnect assembly comprising:

a contact set including an electrically insulating flexible film having at least one conductive contact suspended therein, said flexible film further having formed therein at least one de-coupling hole, proximate said at least one conductive contact; and a compressible interposer comprising an electrically insulating elastomer sheet as a matrix for at least one electrically conducting elastic column to provide a localized conductive path through the thickness of said elastomer sheet, said compliant interconnect assembly being formed to have a contact resistance less than 40 milli ohms when said contact set lies adjacent said compressible interposer, there being engagement between said at least one conductive contact and said at least one conducting elastic column for electrically connecting said first electronic device and said second electronic device abutting opposite sides of said compliant interconnect assembly.

7. A compliant interconnect assembly to electrically connect a first electronic device to a second electronic device, said compliant interconnect assembly comprising:

a contact set including an electrically insulating flexible film having at least one elongate conductive contact suspended therein, said at least one elongate conductive contact having opposing contact surfaces separated by a central portion, said at least one elongate conductive contact being suspended in said insulating flexible film by said central portion to allow said opposing contact surfaces to protrude outwardly from said insulating flexible film, said insulating flexible film further having formed therein at least one de-coupling hole, proximate said central portion of said at least one elongate conductive contact; and a compressible interposer comprising an electrically insulating elastomer sheet as a matrix for at least one electrically conducting elastic column to provide a localized conductive path through the thickness of said insulating elastomer sheet, said compliant interconnect assembly being formed when said contact set lies adjacent said compressible interposer, there being engagement between said at least one elongate conductive contact and said at least one conducting elastic column for electrically connecting said first electronic device and said second electronic device abutting opposite sides of said compliant interconnect assembly.

8. A compliant interconnect assembly according to claim 7, wherein said at least one electrically conducting elastic column has an elongate shape disposed along a single longitudinal axis having a substantially perpendicular relationship with the plane of said electrically insulating elastomer sheet.

9. A compliant interconnect between a first electrical component and a second electrical component, said compliant interconnect comprising:

an electrically insulating flexible sheet having only one layer having at least one conducting pathway therethrough, said electrically insulating flexible sheet further having formed therein at least one de-coupling hole proximate said at least one conducting pathway said electrically insulating flexible sheet further having a thickness and said at least one conducting pathway being an elongate pathway disposed along a single longitudinal axis, said elongate pathway including opposing ends and a central portion located in said thickness of said insulating flexible sheet, said opposing ends protruding outwardly from said electrically insulating flexible sheet.

10. A compliant interconnect according to claim 9, wherein said conducting pathway is a metallic conductive contact.

11. A compliant interconnect according to claim 9, wherein said insulating, flexible sheet comprises plastic film.

12. A compliant interconnect according to claim 11 wherein said plastic film is a polyimide film.

13. A compliant interconnect between a first electrical component and a second electrical component, said compliant interconnect comprising:

an electrically insulating flexible sheet having only one layer having at least one conducting elastic column providing a conducting pathway therethrough, said at least one conducting elastic column having an elongate shape disposed along a single longitudinal axis having a substantially perpendicular relationship with the plane of said electrically insulating flexible sheet, said flexible sheet further having formed therein at least one de-coupling hole, proximate said at least one conducting elastic column.

14. A compliant interconnect according to claim 13, wherein said at least one conducting elastic column comprises conductive particles.

15. A compliant interconnect according to claim 14 wherein said conductive particles are selected from the group consisting of metal particles and conductive carbon particles.

16. A compliant interconnect according to claim 13, wherein said electrically insulating, flexible sheet comprises an elastomer sheet.

17. A compliant interconnect according to claim 16 wherein said elastomer sheet comprises a cured silicone.

18. A compliant interconnect assembly to electrically connect a first electronic device to a second electronic device, said compliant interconnect assembly comprising:

a contact set including an electrically insulating flexible film having at least one conductive contact suspended therein, said flexible film further having formed therein at least one de-coupling hole, proximate said at least one conductive contact to reduce direct influence of movement of said electrically insulating film on freedom of movement of said at least one conductive contact; and a compressible interposer comprising an electrically insulating elastomer sheet as a matrix for at least one electrically conducting elastic column to provide a localized conductive path through the thickness of said elastomer sheet, said compliant interconnect assembly being formed when said contact set lies adjacent said compressible interposer, there being engagement between said at least one conductive contact and said at least one conducting elastic column for electrically connecting said first electronic device and said second electronic device abutting opposite sides of said compliant interconnect assembly.

19. A compliant interconnect assembly according to claim 18, said electrically insulating elastomer sheet having formed therein at least one de-coupling hole proximate said at least one electrically conducting elastic column to reduce direct influence of movement of said electrically insulating elastomer sheet on freedom of movement of said at least one electrically conducting elastic column.

* * * * *